(12) United States Patent
Eguchi et al.

(10) Patent No.: US 10,448,549 B2
(45) Date of Patent: Oct. 15, 2019

(54) COMPONENT SUPPLY DEVICE, COMPONENT MOUNTING SYSTEM, AND COMPONENT MOUNTING METHOD

(71) Applicant: Panasonic Intellectual Property Management Co., Ltd., Osaka (JP)

(72) Inventors: Ryouji Eguchi, Yamanashi (JP); Shuuichi Kubota, Yamanashi (JP); Takashi Tamura, Yamanashi (JP); Seiichi Matsuo, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 516 days.

(21) Appl. No.: 15/190,380

(22) Filed: Jun. 23, 2016

(65) Prior Publication Data
US 2017/0020040 A1 Jan. 19, 2017

(30) Foreign Application Priority Data
Jul. 15, 2015 (JP) .................. 2015-140988

(51) Int. Cl.
| | | |
|---|---|---|
| *B23P 19/00* | (2006.01) | |
| *H05K 13/04* | (2006.01) | |
| *H05K 13/02* | (2006.01) | |
| *H05K 13/08* | (2006.01) | |

(52) U.S. Cl.
CPC ....... *H05K 13/021* (2013.01); *H05K 13/0434* (2013.01); *H05K 13/084* (2018.08)

(58) Field of Classification Search
CPC .... H05K 3/30; H05K 13/0084; H05K 13/021; H05K 13/08; H05K 13/04; H05K 13/046
See application file for complete search history.

(56) References Cited

U.S. PATENT DOCUMENTS

| | | | | |
|---|---|---|---|---|
| 5,727,311 | A * | 3/1998 | Ida .................. | H05K 13/021 29/832 |
| 7,003,872 | B2 * | 2/2006 | Mimura ............ | H05K 13/0413 29/832 |
| 8,196,294 | B2 * | 6/2012 | Kino ................ | H05K 13/0434 29/832 |

(Continued)

FOREIGN PATENT DOCUMENTS

| | | |
|---|---|---|
| JP | H09-018188 A | 1/1997 |
| JP | H11-251800 A | 9/1999 |

(Continued)

OTHER PUBLICATIONS

Chinese Search Report dated Jul. 2, 2019 for the related Chinese Patent Application No. 201610554545.6.

*Primary Examiner* — Paul D Kim
(74) *Attorney, Agent, or Firm* — Pearne & Gordon LLP

(57) ABSTRACT

A component supply device of the disclosure includes: a loader being capable of accommodating a plurality of stick cases in a stacked state, each of the plurality of stick cases being capable of accommodating a plurality of electronic components, each of the plurality of stick cases having an opening in an end portion in a longitudinal direction; a component transporter moving one or more electronic components supplied from the plurality of stick cases to a predetermined component supply position; and a stick case detector detecting presence or absence of one or more stick cases in the loader.

14 Claims, 11 Drawing Sheets

(56) References Cited

U.S. PATENT DOCUMENTS

| | | | |
|---|---|---|---|
| 8,328,498 B2* | 12/2012 | Higashida | H05K 13/0434 |
| | | | 414/806 |
| 2005/0071997 A1* | 4/2005 | Oyama | H05K 13/0812 |
| | | | 29/832 |
| 2008/0147232 A1* | 6/2008 | Kuribayashi | H05K 13/0895 |
| | | | 700/160 |
| 2009/0259333 A1 | 10/2009 | Yano et al. | |
| 2013/0297056 A1 | 11/2013 | Miyamoto et al. | |

FOREIGN PATENT DOCUMENTS

| | | |
|---|---|---|
| JP | 2007-109779 | 4/2007 |
| JP | 2013-251532 A | 12/2013 |

* cited by examiner

COMPONENT SUPPLY DEVICE, COMPONENT MOUNTING SYSTEM, AND COMPONENT MOUNTING METHOD

BACKGROUND

1. Technical Field

The present disclosure relates to a component supply device which supplies an electronic component, a component mounting system which uses the component supply device, and a component mounting method.

2. Description of the Related Art

In a component mounting system which mounts an electronic component on a substrate, a component mounting operation of unloading the electronic component from a component supply device, such as a tape feeder set in a component mounting device and transferring and loading the electronic component on the substrate, is repeatedly performed. A component mounting device which has a traceability managing function and is capable of performing a post-retrospective trace by managing and recording a component type or manufacturing lot of the electronic component supplied by the component supply device in the related art, from requirements on the quality management or production management in the component mounting operation, is known (for example, refer to Japanese Patent Unexamined Publication No. 2007-109779). In the related art illustrated in Japanese Patent Unexamined Publication No. 2007-109779, by reflecting timing when a joint of a carrier tape is detected by the tape feeder in mounting history data in which a unit mounting history which makes a mounting point at which the electronic component is loaded on the substrate correspond to the tape feeder which supplies the electronic component is written in a time-series order, and tape changing history information which divides a plurality of mounting points on the substrate for every carrier tape is created.

However, an example of the component supply device which is used in the component mounting device, is a stick feeder which uses a long hollow stick case as a carrier that accommodates the electronic component. In the stick feeder, when a plurality of stick cases in which a plurality of electronic components are accommodated in advance are layered, and one stick case becomes empty by unloading the component, the component for the next target stick case is unloaded in order. In addition, even in the component supply by the stick feeder, it is desirable that the above-described traceability managing function is realized.

SUMMARY

A component supply device of the disclosure includes: a loader being capable of accommodating a plurality of stick cases in a stacked state, each of the plurality of stick cases being capable of accommodating a plurality of electronic components, each of the plurality of stick cases having an opening in an end portion in a longitudinal direction; a component transporter moving one or more electronic components supplied from the plurality of stick cases to a component supply position; and a stick case detector detecting presence or absence of one or more stick cases in the loader.

A component mounting system of the disclosure includes: a component mounting device including a component supply device; and a managing device being connected to the component mounting device by a network. In addition the component supply device includes a loader being capable of accommodating a plurality of stick cases in a stacked state, each of the plurality of stick cases being capable of accommodating a plurality of electronic components, each of the plurality of stick cases having an opening in an end portion in a longitudinal direction, a component transporter moving one or more electronic components supplied from the plurality of stick cases to a component supply position, and a stick case detector detecting presence or absence of one or more stick cases in the loader.

A component mounting method in a component mounting system of the disclosure which includes: a component mounting device including a component supply device; and a managing device being connected to the component mounting device by a network. The component supply device including: a loader being capable of accommodating a plurality of stick cases in a stacked state, each of the plurality of stick cases being capable of accommodating a plurality of electronic components, each of the plurality of stick cases having an opening in an end portion in a longitudinal direction; and a component transporter moving one or more electronic components supplied from the plurality of stick cases to a component supply position. The component mounting method of the disclosure comprising: storing, in the storage, component information of stick cases accommodated in the loader; detecting presence or absence of one or more stick cases in the loader by a stick case detector; and determining a state of one or more stick cases accommodated in the loader, from a detection result of the stick case detector and the component information of stick cases stored in the storage.

DETAILED DESCRIPTION

Prior to the description of an embodiment of the disclosure, problems in a component supply device in the related art will be simply described.

There are the following problems after realizing a traceability managing function in the component supply by a stick feeder. In other words, in the component supply by the stick feeder, since the same type of electronic components are not continuously supplied in a large volume unlike a tape feeder, a case where a stick case during the electronic component being unloaded is extracted from the stick feeder, or a new stick case is added to the stick feeder is inevitable. Therefore, it is difficult to accurately determine a state of the stick case in the component supply state in the stick feeder, and to appropriately manage the component supply.

Embodiment

Figure 1:
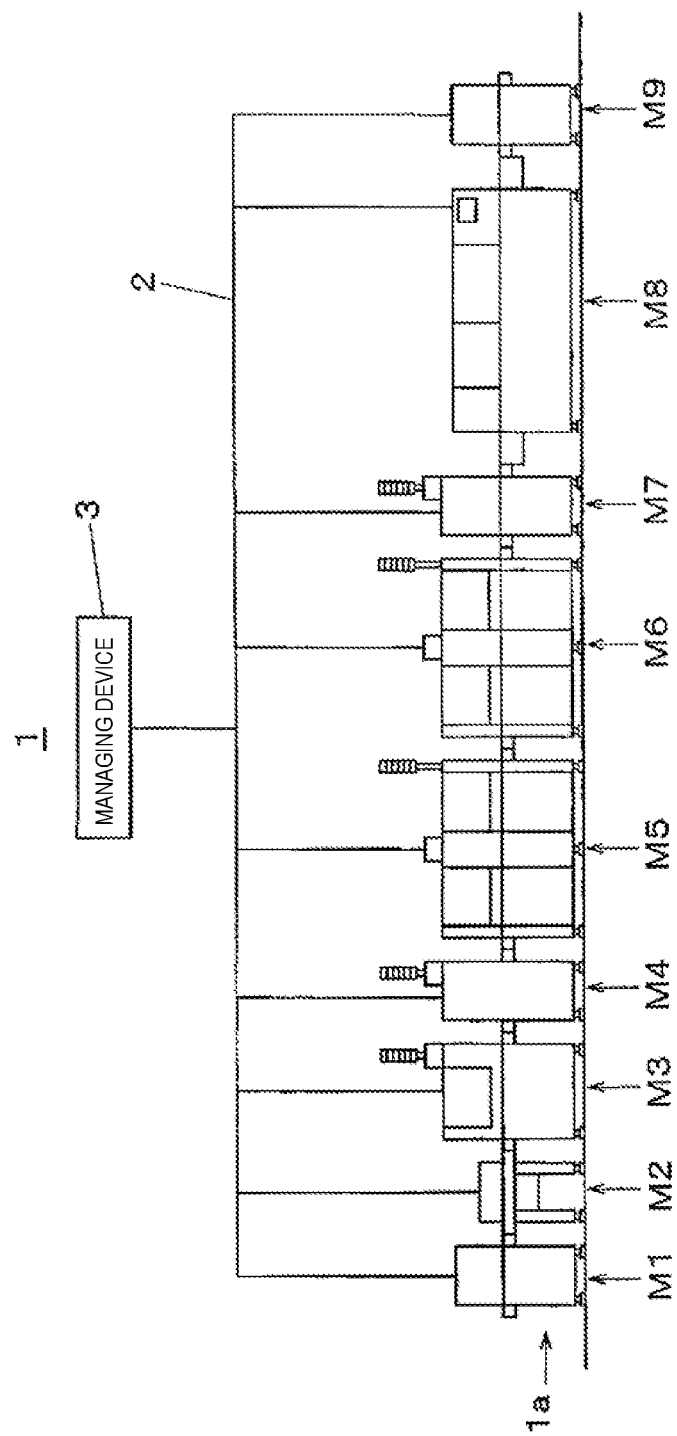
FIG. 1 is a configuration view illustrating a component mounting system of one embodiment of the disclosure.

Next, the embodiment of the disclosure will be described with reference to the drawings. First, with reference to FIG. 1, a configuration of component mounting system 1 will be described. Component mounting system 1 has a function of producing a mounting substrate by mounting the electronic component on the substrate by soldering. In order to perform the component mounting work, component mounting system 1 includes: component mounting line 1a having a configuration in which substrate supply device M1, substrate delivery device M2, printing device M3, inspection device M4, component mounting devices M5 and M6, inspection device M7, reflow device M8, and substrate collecting device M9 are linked to each other; and managing device 3 which is connected to component mounting line 1a by network 2.

Substrate supply device M1 supplies substrate 6 (refer to FIG. 2) which is a target of the component mounting. Supplied substrate 6 is transported into printing device M3 via substrate delivery device M2. Printing device M3 performs screen printing with respect to the paste-like solder, such as a cream solder, on an electrode for component joining formed on substrate 6. Inspection device M4 performs quality determination of a printing state of the solder printed on the substrate, or printing inspection including the detection of printing position shift of the solder with respect to the electrode. Component mounting devices M5 and M6 consecutively load the electronic component on substrate 6 on which the solder is printed by printing device M3. Inspection device M7 inspects the component mounting state on substrate 6 after the electronic component is mounted. Reflow device M8 solders the electronic component on the substrate by melting the solder, and by heating substrate 6 after loading the electronic component according to a predetermined temperature profile. Substrate collecting device M9 collects substrate 6 after the reflow and substrate 6 which is a completed product on which the electronic component is mounted.

Figure 2:
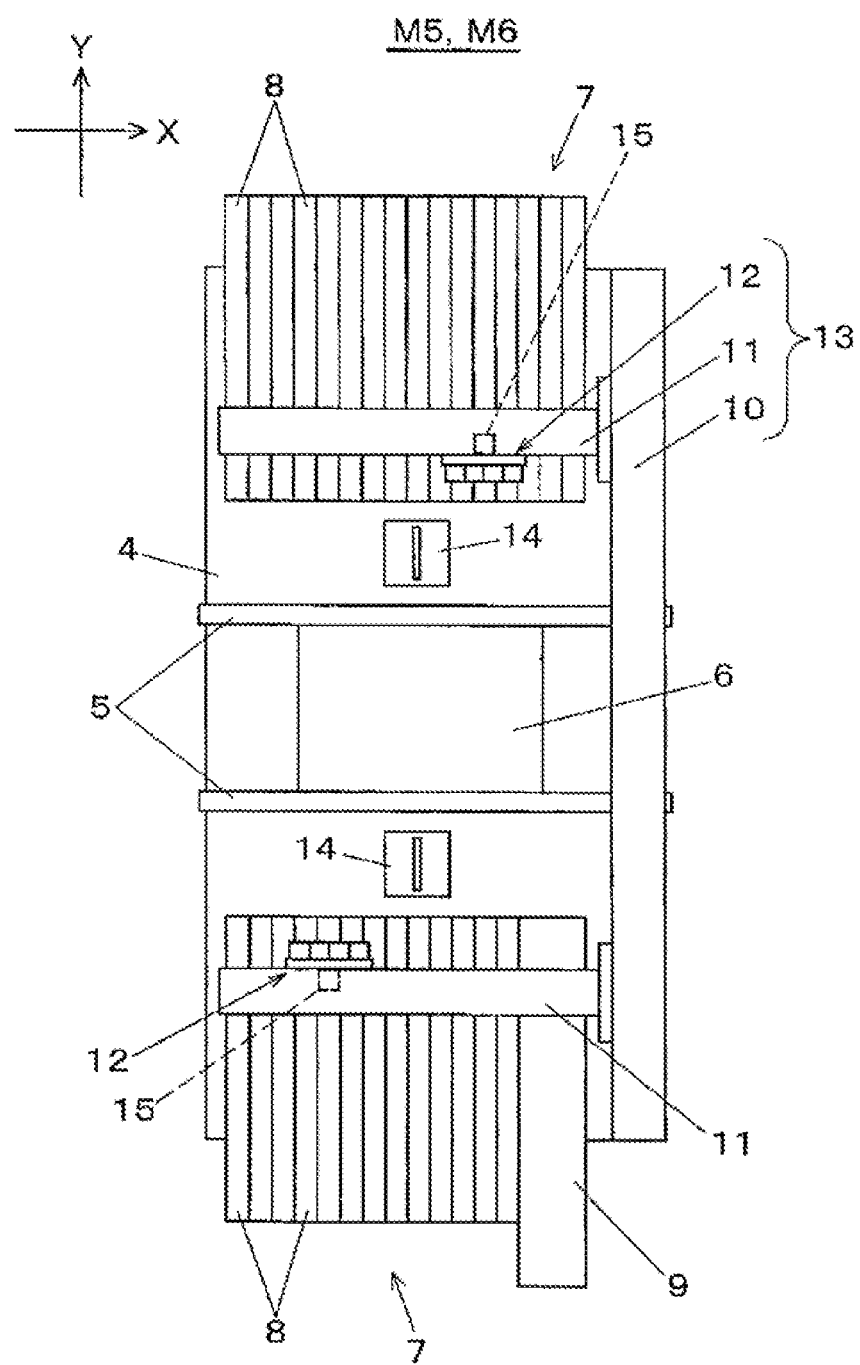
FIG. 2 is a plan view of a component mounting device which configures the component mounting system of the embodiment of the disclosure.

Next, with reference to FIG. 2, a configuration of component mounting devices M5 and M6 will be described. In FIG. 2, substrate transporting mechanism 5 is installed in the X direction (substrate transporting direction) at the center of base 4 in FIG. 2. Substrate transporting mechanism 5 transports substrate 6 transported from an upstream side, and positions and holds substrate 6 on a mounting stage set for performing the component mounting work. On both sides of substrate transporting mechanism 5, component suppliers 7 are disposed. A plurality of tape feeders 8 are mounted in parallel on one component supplier 7, and stick feeder 9 is mounted on the other component supplier 7 together with the plurality of tape feeders 8.

Tape feeder 8 supplies the electronic component to the component supply position toward a mounting head of the component mounting mechanism which will be described hereinafter, by pitch-feeding a carrier tape accommodated with the electronic component in the tape feeding direction. Stick feeder 9 similarly has a function as a component supply device, accommodates stick case 16 in which the plurality of electronic components are accommodated on the inside where an opening is present in the length direction in a stacked state, and similarly supplies the electronic component from stick case 16 to component supply position 28a (FIG. 3C) to the mounting head. In other words, component mounting system 1 illustrated in the embodiment includes component mounting devices M5 and M6 including stick feeder 9 which serves as a component supply device, and managing device 3 connected to component mounting devices M5 and M6 by network 2.

Y-axis moving table 10 having a linear driving mechanism is installed in an end portion on one side in the X direction on an upper surface of base 4, and two X-axis moving tables 11 similarly having the linear driving mechanism are combined with Y-axis moving table 10 to be freely movable in the Y direction. On two X-axis moving tables 11, each mounting head 12 is mounted to be freely movable in the X direction. By driving Y-axis moving table 10 and X-axis moving table 11, mounting head 12 moves in the X direction and in the Y direction. Accordingly, two mounting heads 12 unload the electronic component from the component supply position by tape feeder 8 or stick feeder 9 that are disposed in each corresponding component supplier 7, and transfer and load electronic component on substrate 6 positioned in substrate transporting mechanism 5. Y-axis moving table 10, X-axis moving table 11, and mounting head 12 configure component mounting mechanism 13 which suction, hold, and unload the electronic component from component supplier 7, and transfers and loads electronic component on substrate 6.

Component recognizing camera 14 is disposed between component supplier 7 and substrate transporting mechanism 5. When mounting head 12 which unloads the electronic component from component supplier 7 moves above component recognizing camera 14, component recognizing camera 14 captures and recognizes the electronic component in a state of being held by mounting head 12. Substrate recognizing camera 15 which is positioned on a lower surface side of X-axis moving table 11 and moves integrally with mounting head 12, is mounted on mounting head 12. As mounting head 12 moves, substrate recognizing camera 15 moves above substrate 6 positioned in substrate transporting mechanism 5, and captures and recognizes substrate 6. In the component mounting operation to substrate 6 by mounting head 12, loading position correction is performed based on the recognition result of the electronic component by component recognizing camera 14 and the substrate recognition result by substrate recognizing camera 15.

Next, with reference to FIGS. 3A to 3C, a configuration and a function of stick feeder 9 will be described. Stick feeder 9 includes loader 20 which accommodates the plurality of stick cases 16 in a stacked state, and component transporter 30. Component transporter 30 has a function of moving the electronic component supplied from accommodated stick case 16, to component supply position 28a Loader 20 includes first guide 21 and second guide 22 which are installed in a posture of being inclined in the component supply direction, and are disposed being opposite to each other. Stacked space 20a for stacking the plurality of stick cases 16 between first guide 21 and second guide 22, is formed.

Figure 3A:
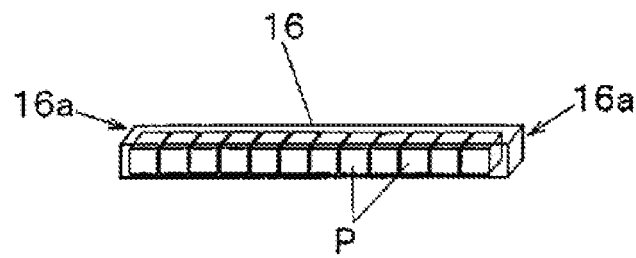
FIG. 3A is a configuration view illustrating a stick case of the embodiment of the disclosure.

As illustrated in FIG. 3A, stick case 16 is a hollow elongated container in which openings 16a are provided in both ends, and a plurality of electronic components P are accommodated in series on the inside of stick case 16. In other words, loader 20 has a function of stacking stick case 16 in which the plurality of electronic components P are accommodated, and which has an opening in the length direction.

Figure 3B:
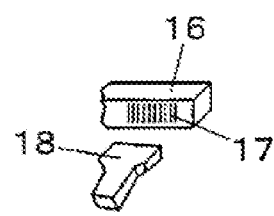
FIG. 3B is a configuration view illustrating a bar code label of the stick case of the embodiment of the disclosure.

As illustrated in FIG. 3B, bar code label 17 illustrating component information, such as the name of electronic component P accommodated in stick case 16 or the lot name, is attached to one side end surface of stick case 16, and when stick case 16 is set in loader 20, as an operator reads bar code label 17 by bar code reader 18, the component information is read and component collating processing is performed.

Figure 3C:
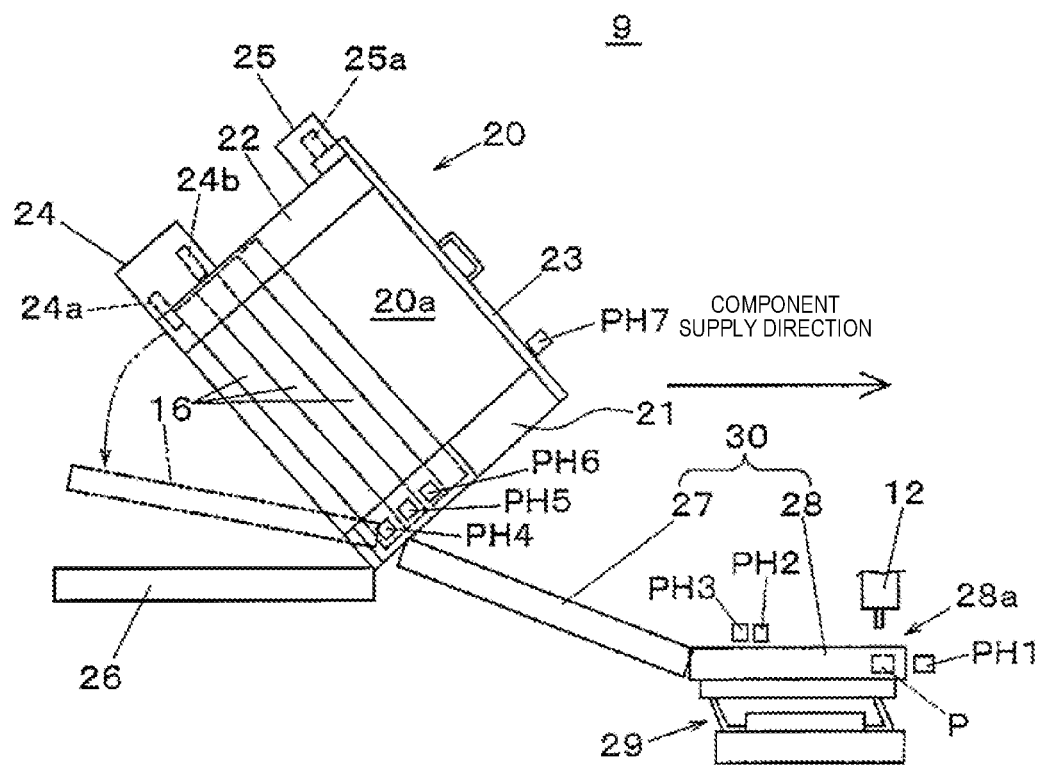
FIG. 3C is a configuration view illustrating a stick feeder (component supply device) of the embodiment of the disclosure.

As illustrated in FIG. 3C, lid material 23 which is freely opened and closed is installed in an upper portion of first guide 21 and second guide 22. Lid material 23 has a function of blocking the opening for supplying stick case 16 to loader 20, and is capable of setting stick case 16 in stacked space 20a only in a state where lid material 23 is opened. In a state where stick case 16 is set in stacked space 20a, both end portions of stick case 16 in the longitudinal direction are guided by first guide 21 and second guide 22, and the position is held.

At this time, stick case 16 is in a posture of being inclined in the component supply direction, and a component transporting force in the inclination direction by gravity acts on electronic component P accommodated in stick case 16. Accordingly, electronic component P in stick case 16 positioned on the lowest step in stacked space 20a is transferred to slide linker 27 which is installed to be inclined in the component supply direction. In other words, the position on the lowest step in stacked space 20a becomes a supply position which positions stick case 16 that is a component supply target in loader 20.

The end portion of slide linker 27 is linked to oscillation transporter 28 which is horizontally installed, and oscillation transporter 28 includes oscillation mechanism 29. In a state where oscillation mechanism 29 is driven, when electronic component P is transferred to oscillation transporter 28 from slide linker 27, electronic component P moves on oscillation transporter 28 in the component supply direction. In addition, electronic component P which has reached component supply position 28a is suctioned, held, and unloaded by mounting head 12.

In other words, slide linker 27 and oscillation transporter 28 configure component transporter 30 which moves electronic component P supplied from stick case 16 of loader 20 to predetermined component supply position 28a. In addition, a path through which electronic component P moves in slide linker 27 and oscillation transporter 28 becomes the component transporting path through which electronic component P supplied from stick case 16 of loader 20 is transported to predetermined component supply position 28a.

In second guide 22 on the opposite side in the component supply direction, stick discharge mechanism 24 and lid member locking mechanism 25 are provided. Stick discharge mechanism 24 has a function of dropping only stick case 16 on the lowest step and discharging stick case 16 to case collector 26 among the plurality of stick cases 16 accommodated in stacked space 20a, by controlling an advancing and retreating operation in stacked space 20a of two locking members 24a and 24b.

In other words, stick case 16 which feeds out all of electronic components P by the component supply and becomes empty is discharged and dropped by stick discharge mechanism 24, and is collected to case collector 26. Accordingly, next stick case 16 which is positioned directly on stick case 16 on the lowest step is positioned at the supply position of electronic component P. In other words, loader 20 includes a supply stick changer which changes stick case 16 positioned at the supply position in loader 20.

Lid member locking mechanism 25 has a function of prohibiting an opening operation of closed lid material 23 by controlling the operation of locking member 25a. Accordingly, new stick case 16 is physically prohibited from being supplied to loader 20 in stick feeder 9, and the supply of electronic component P to loader 20 can be restricted only to the predetermined timing set in advance. Therefore, lid material 23 and lid member locking mechanism 25 function as a supply prohibitor which physically prohibits electronic component P from being supplied to loader 20.

In stick feeder 9, seven photo sensors (hereinafter, simply referred to as "sensor") PH1 to PH7 are equipped. Sensors PH1 to PH3 function as component detector 56 (refer to FIG. 4). In other words, sensor PH1 detects whether or not electronic component P has reached component supply position 28a in oscillation transporter 28. In addition, sensors PH2 and PH3 are disposed in oscillation transporter 28 which serves as the component transporting path, and detects electronic component P on the component transporting path, that is, the electronic component P in a state of being moved by oscillation transporter 28. Accordingly, the number of electronic components P which pass through oscillation transporter 28 is counted, and a terminal end of the lot of electronic component P supplied from one stick case 16 can be detected.

In addition, in the embodiment, an example in which two sensors PH2 and PH3 are disposed in oscillation transporter 28 is illustrated, but the positions of sensors PH2 and PH3 are not limited to oscillation transporter 28, and sensors PH2 and PH3 may be disposed in slide linker 27 which is a passing path of electronic component P. Furthermore, instead of installing two sensors PH2 and PH3 in parallel, the count of the number of electronic components P or the terminal end of the lot may be detected only by one sensor.

Among the accommodation positions of stick cases 16 in stacked space 20a, sensors PH4, PH5, and PH6 are installed in order from the lowest step at three lower accommodation positions. Sensors PH4, PH5, and PH6 function as stick case detector 57 (FIG. 4), and detect the presence or the absence of stick case 16 at each accommodation position. In other words, sensors PH4, PH5, and PH6 which function as stick case detector 57 detect the presence or the absence of the plurality of stick cases 16 stacked in loader 20. In lid material 23, sensor PH7 is provided. Sensor PH7 functions as lid member locking detector 58 (FIG. 4), and detects that lid material 23 is closed by lid member locking mechanism 25.

Figure 4:
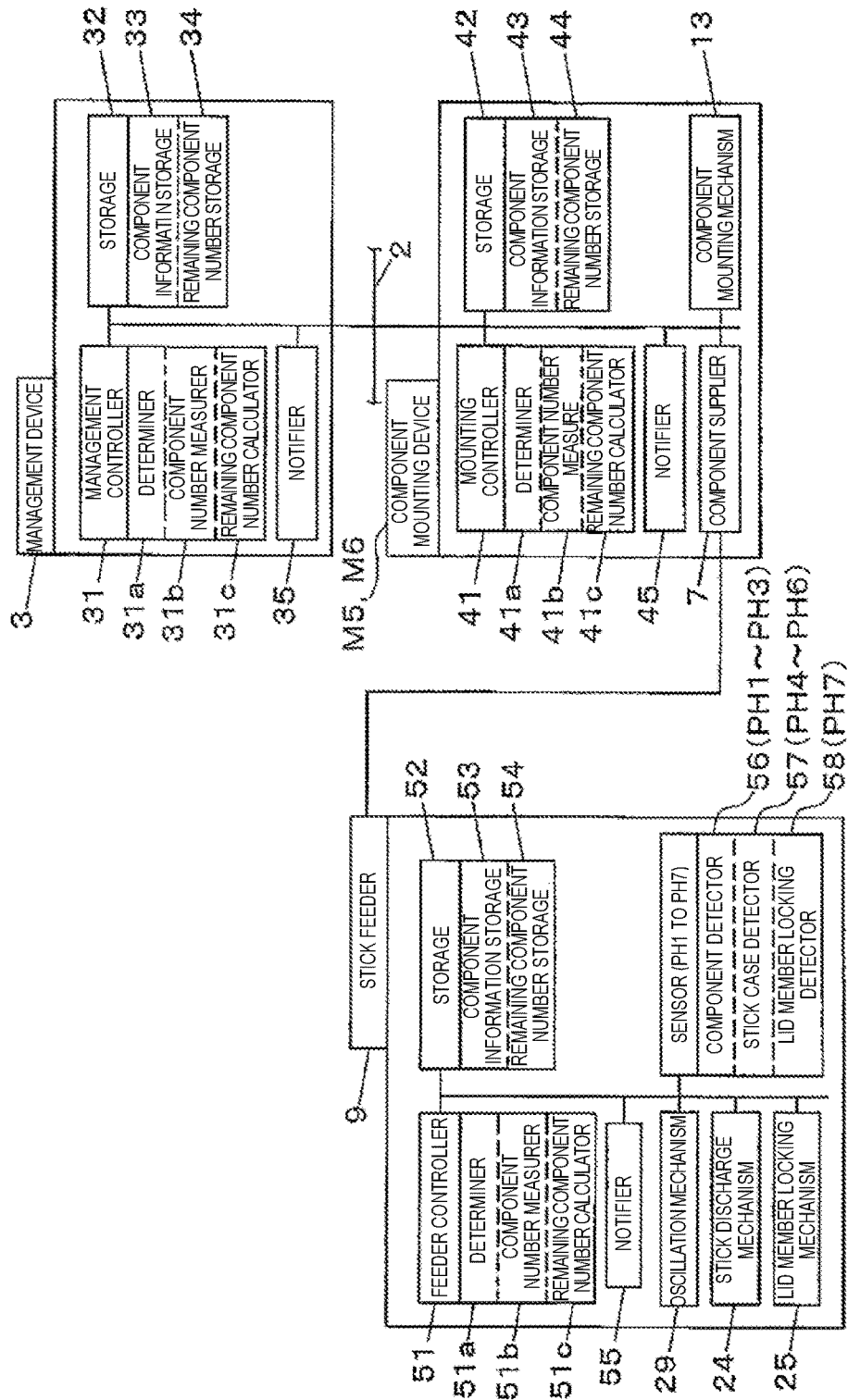
FIG. 4 is a block diagram illustrating a configuration of a control system of a component mounting system of the embodiment of the disclosure.
Figure 5:
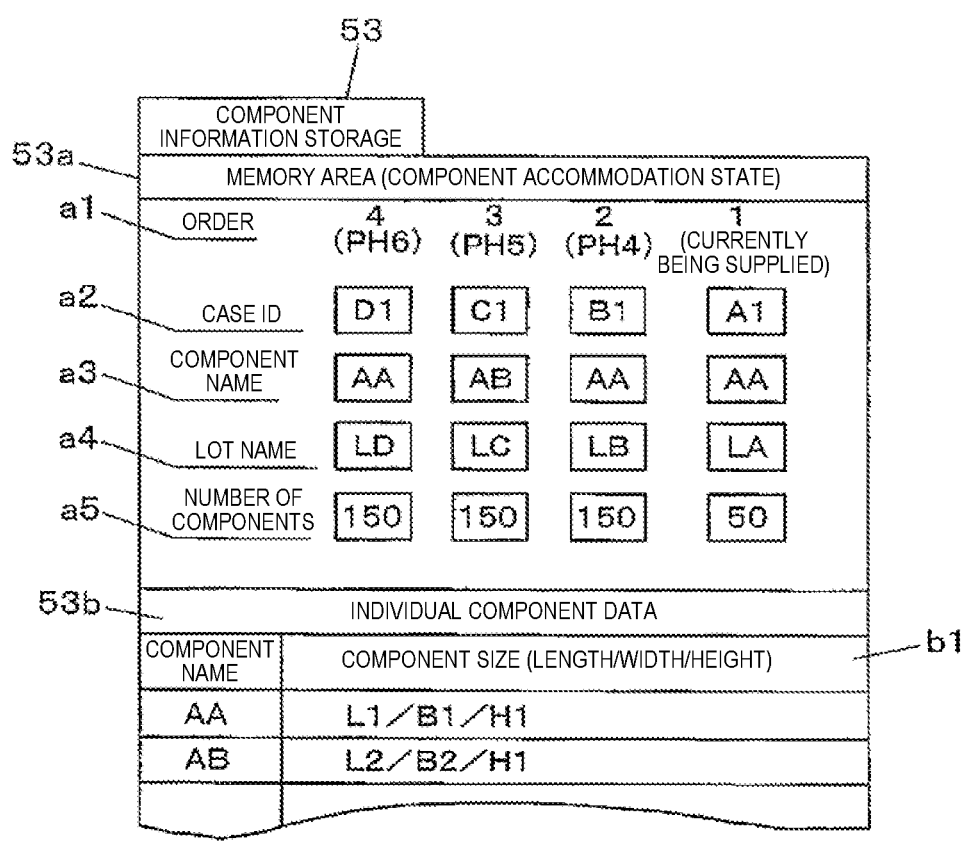
FIG. 5 is a view illustrating storage contents of component information storage in the component supply device of the embodiment of the disclosure.

Next, with reference to FIGS. 4 and 5, a configuration of a control system will be described. In FIG. 4, stick feeder 9 includes feeder controller 51, storage 52, and notifier 55. Furthermore, feeder controller 51 includes determiner 51a, component number measurer 51b, and remaining component number calculator 51c, and storage 52 stores various programs or data which are necessary in the component supply operation in addition to data stored in component information storage 53 and remaining component number storage 54. Component information storage 53 stores the component information of stick case 16 stacked in loader 20, that is, memory area 53a and individual component data 53b that are illustrated in FIG. 5, are stored. Remaining component number storage 54 stores the remaining number of components accommodated in stick feeder 9 at each timing in real time.

Memory area 53a records trace information which is data illustrating a state of component accommodation in stick feeder 9, and illustrating a component supply history by stick feeder 9. Here, every time new stick case 16 is supplied to loader 20, as the operator reads bar code label 17 by bar code reader 18, the component information is input. Individual component data 53b stores attribute data which regulates characteristics of each electronic component, such as component size b1 illustrating the length/width/height of the electronic component, for each component type (component name).

Here, a configuration of memory area 53a will be described. Memory area 53a has a configuration in which each item of "case ID" a2, "component name" a3, "lot name" a4, and "number of components" a5 corresponds to the component supply order illustrated by "order" a1. Here, the order 1 illustrating "order" a1 reaches component supply position 28a and corresponds to electronic component P detected by sensor PH1. The orders 2, 3, and 4 correspond to stick cases 16 positioned in order from the lower end side of stacked space 20a in loader 20, and become detection targets by each of sensor PH4, sensor PH5, and sensor PH6.

"Case ID" a2 is an identification code which individually specifies stick case 16, and the example illustrated in FIG. 5, (A1) illustrated in the order 1 illustrates that electronic component P which has reached component supply position 28a and is currently supplied is the electronic component unloaded from case ID(A1). In addition, (B1), (C1), and (D1) which respectively correspond to the orders 2, 3, and 4 illustrate the case ID which specifies stick case 16 detected by each of sensors PH4, PH5, and PH6 that are stacked on stacked space 20a.

"Component name" a3 and "lot name" a4 illustrate the component name of the electronic component which corresponds to the above-described case ID, and the lot name. In addition, "number of components" a5 illustrates the number of components of the electronic component which corresponds to each "order" a1 in real time. In other words, in the orders 2, 3, and 4 illustrated in "order" a1, since stick case 16 which has not been used is accommodated as it is, (150) which is the initial component accommodation number is illustrated, and in the order 1, a current value (here, 50) which is obtained by subtracting the number of consumed components unloaded from component supply position 28a, from the initial component accommodation number in order, is illustrated.

Feeder controller 51 controls oscillation mechanism 29, stick discharge mechanism 24, and lid member locking mechanism 25, with reference to the detection result by component detector 56 and stick case detector 57, and based on various pieces of data and programs stored in storage 52. Accordingly, the component supply operation of transporting electronic component P supplied from stick case 16 stacked on loader 20 to component supply position 28a, and supplying electronic component P to mounting head 12, is performed.

In the component supply operation, determiner 51a determines a detection state of stick case detector 57, and a state of stick case 16 stacked on loader 20 from the component information of stick case 16 stored in component information storage 53 of storage 52. Furthermore, determiner 51a determines the change of the lot of the stick case unit, based on the number of electronic components measured by component number measurer 51b, and the number of electronic components unloaded from component supply position 28a.

In addition, component number measurer 51b measures the number of electronic components P based on the detection result of sensors PH2 and PH3 which serve as component detector 56. Remaining component number calculator 51c measures the number of remaining components based on the number of electronic components P measured by component number measurer 51b. The measurement result is stored in remaining component number storage 54. Notifier 55 is a display portion, such as a display panel or a signal tower, has a function of performing notification with respect to a work vehicle when a predetermined event regulated in advance occurs. The display panel displays a predetermined notification screen. The signal tower is turned on at a predetermined pattern.

Component mounting devices M5 and M6 include mounting controller 41, storage 42, and notifier 45. Furthermore, mounting controller 41 includes determiner 41a, component number measure 41b, and remaining component number calculator 41c, and storage 42 includes component information storage 43 and remaining component number storage 44. Mounting controller 41 controls component supplier 7 or component mounting mechanism 13 based on various pieces of data or programs stored in storage 42. Accordingly, the component mounting work of mounting electronic component P unloaded from component supplier 7 on substrate 6, is performed.

Managing device 3 includes management controller 31, storage 32, and notifier 35. Furthermore, management controller 31 includes determiner 31a, component number measurer 31b, and remaining component number calculator 31c, and storage 32 includes component information storage 33 and remaining component number storage 34. Management controller 31 manages each device of component mounting line 1a illustrated in FIG. 1 via network 2, based on various pieces of data or programs stored in storage 32. Accordingly, the component mounting work of mounting electronic component P on substrate 6 and producing the mounting substrate, is performed.

In addition, the functions of determiner 41a, component number measure 41b, and remaining component number calculator 41c, and further, the function of determiner 31a, component number measurer 31b, and remaining component number calculator 31c, are similar to the functions of determiner 51a, component number measurer 51b, and remaining component number calculator 51c. In addition, the configuration of information stored in component information storage 43 and remaining component number storage 44, and further, the configuration of information stored in component information storage 33 and remaining component number storage 34, are similar to the information stored in component information storage 53 and remaining component number storage 54. Therefore, the control processing performed by the control function of stick feeder 9 may be performed by the control function of component mounting devices M5 and M6, or by the control function of managing device 3.

Stick feeder 9, component mounting devices M5 and M6, and component mounting system 1 which are illustrated in the embodiment, are configured as described above, and a specific operation of component supply for supplying stick case 16 to stick feeder 9 in the component mounting method by component mounting system 1 having the above-described configuration, will be described.

First, with reference to FIGS. 6, 9A, and 9B, the work processing of component supply to stick feeder 9, that is, of supplying stick case 16 in which electronic component P is accommodated to loader 20, will be described. Here, in a state where electronic component P(A1) unloaded from stick case 16(A1) in which the case ID is (A1) is transported to oscillation transporter 28 and unloaded from component supply position 28a, processing of supplying stick cases 16(B1) to 16(E1) in which the following component is accommodated to loader 20 in order, is illustrated.

Figure 6:
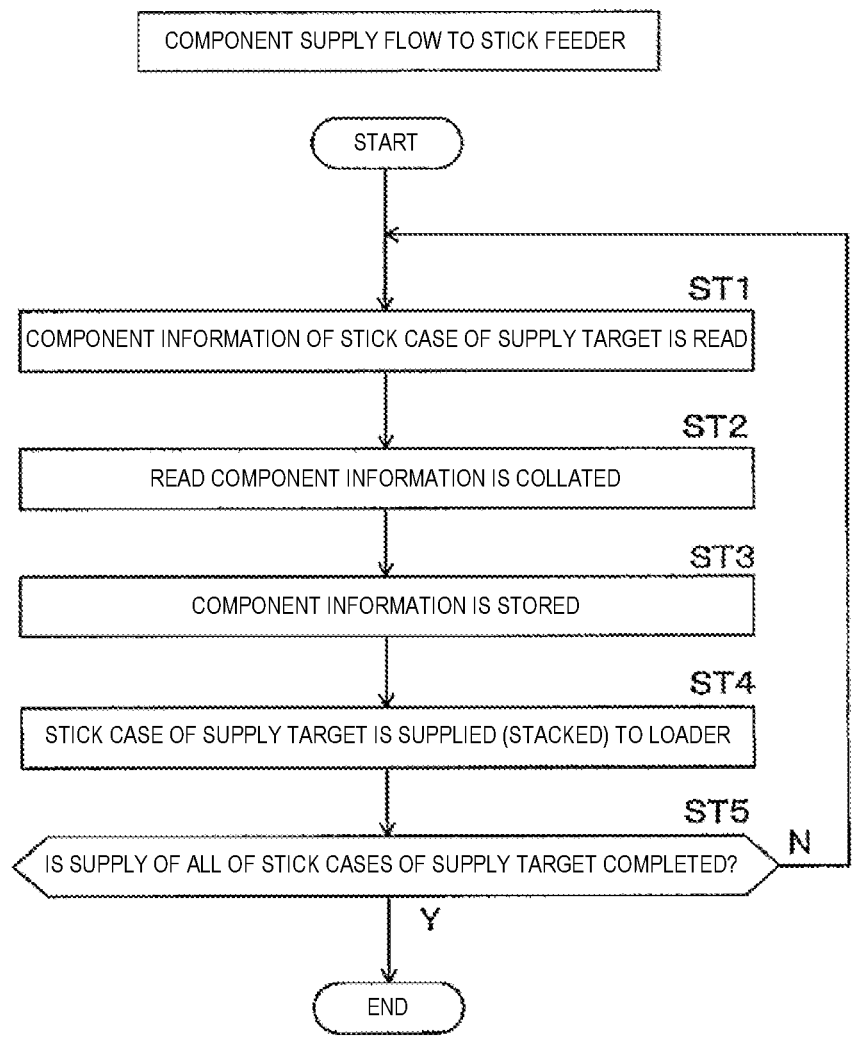
FIG. 6 is a flow diagram illustrating a component supply in the stick feeder of the embodiment of the disclosure.

In FIG. 6, when the work processing is started, first, the component information of stick case 16 (here, initial stick case 16(B1)) of the supply target is read (ST1). In other words, bar code label 17 attached to stick case 16 is read by bar code reader 18 by the operation of the operator (refer to FIG. 3B). Next, the read component information is collated (ST2). In other words, it is determined whether or not the read component information matches component data regulated to production data stored in storage 52 in advance. Here, in a case where it is determined that the read component information matches the production data, the component information is stored in component information storage 53 (ST3).

Figure 9A:
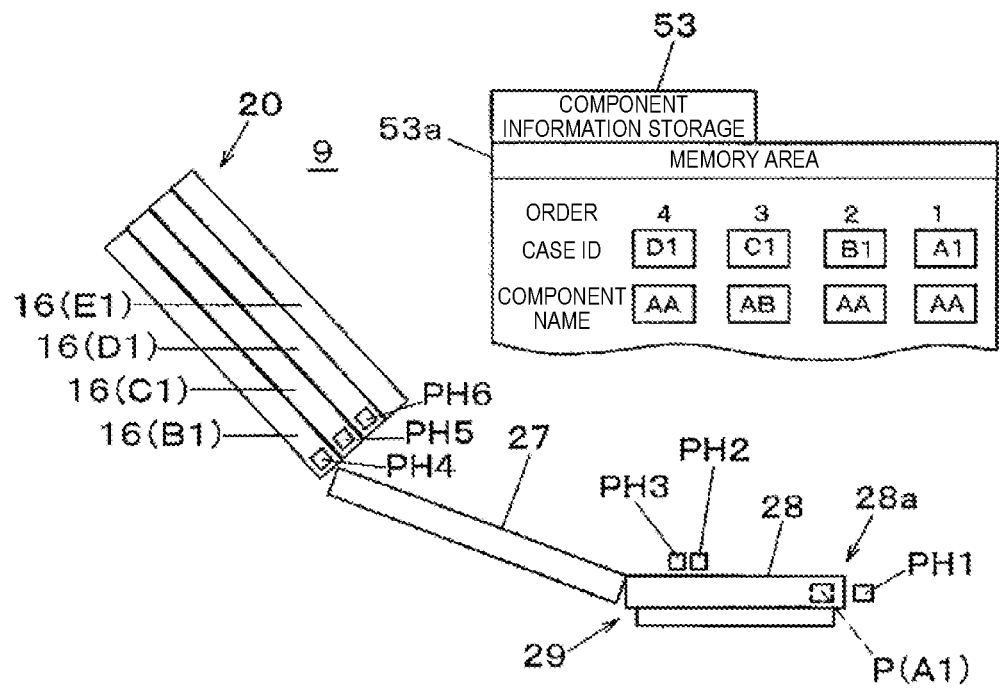
FIG. 9A is a view illustrating the component supply in the stick feeder of the embodiment of the disclosure.

Accordingly, as illustrated in FIG. 9A, in the order 2 of memory area 53a, in accordance with the collation result, case ID(B1), component name (AA) . . . are written. After this, stick case 16(B1) of the supply target is supplied and stacked in loader 20 by the operator (ST4). Next, it is determined whether or not the supply of all of stick cases 16 of the supply target is completed (ST5). Here, in a case where stick case 16 which has not been supplied yet is present, after returning to (ST1), similar processing is repeated.

Accordingly, in the orders 2, 3, and 4 of memory area 53a, in accordance with the collation result, (case ID(B1), component name(AA)), (case ID(C1), component name(AB)), and (case ID(D1), component name(AA)), are written in order. In addition, in loader 20, stick case 16(B1), stick case 16 (C1), stick case 16(D1), and stick case 16(E1) are stacked in order. In this manner, the supply processing is completed as the supply completion with respect to all of the supply targets is confirmed in (ST5).

Figure 9B:
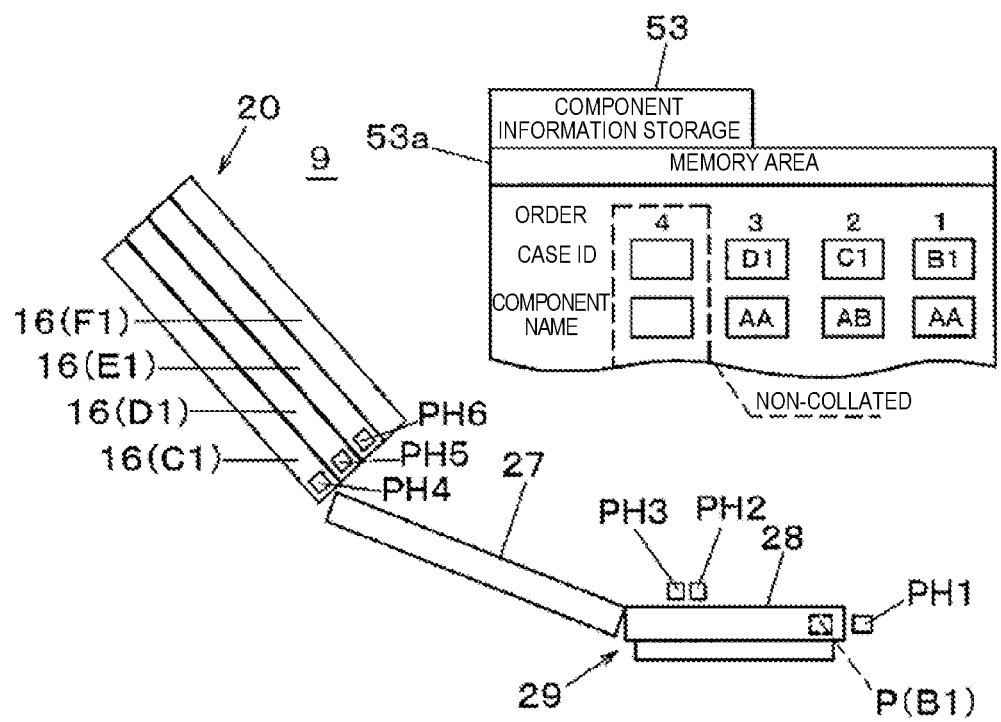
FIG. 9B is a view illustrating the component supply in the stick feeder of the embodiment of the disclosure.

FIG. 9B illustrates a state where all of electronic components P(A1) included in stick case 16(A1) are unloaded, and electronic component P(B1) included in next stick case 16(B1) is transported to oscillation transporter 28 from the state illustrated in FIG. 9A. In this state, (case ID(C1), component name(AB)) is written in the order 2 of memory area 53a, and (case ID(D1), component name (AA)) are written in the order 3.

In addition, in loader 20, above-described stick cases 16(C1), 16(D1), and 16(E1) are stacked. In a case where the collation of stick case 16(E1) is not performed and stick case 16(E1) is maintained in a non-collated state in the component supply, it is ascertained that the order 4 of memory area 53a is maintained as a blank, and stick case 16 positioned at the stacked position (corresponding to photo sensor PH6) is not collated.

Next, with reference to FIG. 7, 10A, and 10B, non-collation detection processing of stick case 16 will be described. The non-collation detection processing detects whether or not non-collated stick case 16 is supplied to loader 20 based on the detection result of stick case detector 57 and stored contents of memory area 53a.

Figure 10A:
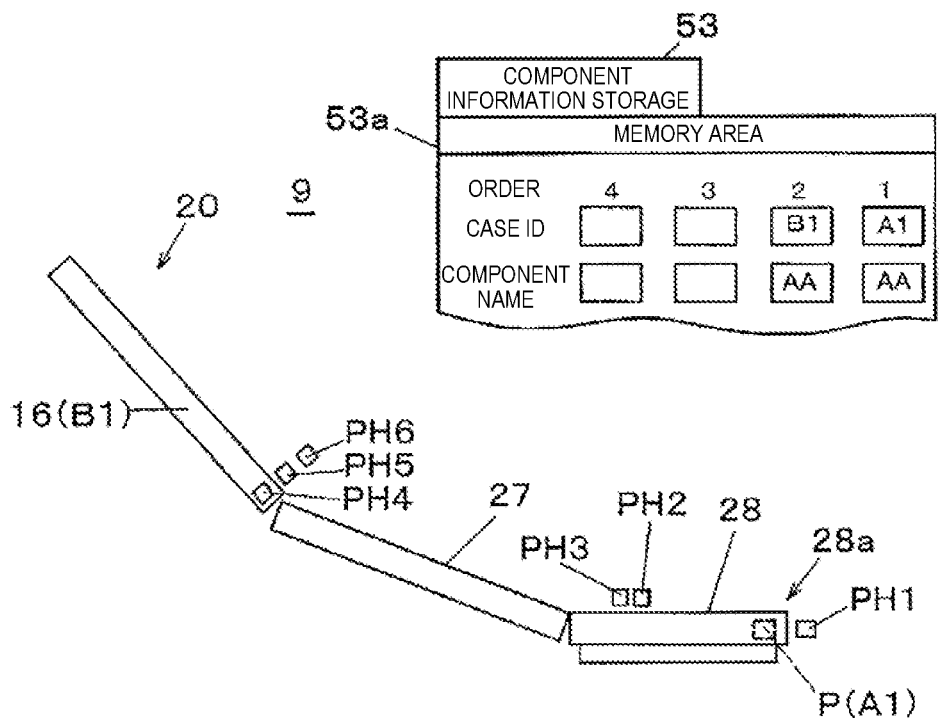
FIG. 10A is a view illustrating the detection processing of the non-collated stick case in the stick feeder of the embodiment of the disclosure.

Here, as illustrated in FIG. 10A, an example in a case where the component collation is not performed and new stick cases 16(C1) to 16(E1) are added and supplied, in a case where case ID(A1) and component name(AA) are written in the order 1 of memory area 53a, only case ID(B1) and component name(AA) are written in order 2, and only stick case 16(B1) is stacked on loader 20. In other words, as illustrated in FIG. 10B, since stick cases 16(C1) to 16(E1) are supplied and stacked on loader 20, and the component collation operation is not performed, memory area 53a of component information storage 53 is not changed from the state illustrated in FIG. 10A, and the orders 3 and 4 are maintained as a blank.

Figure 7:
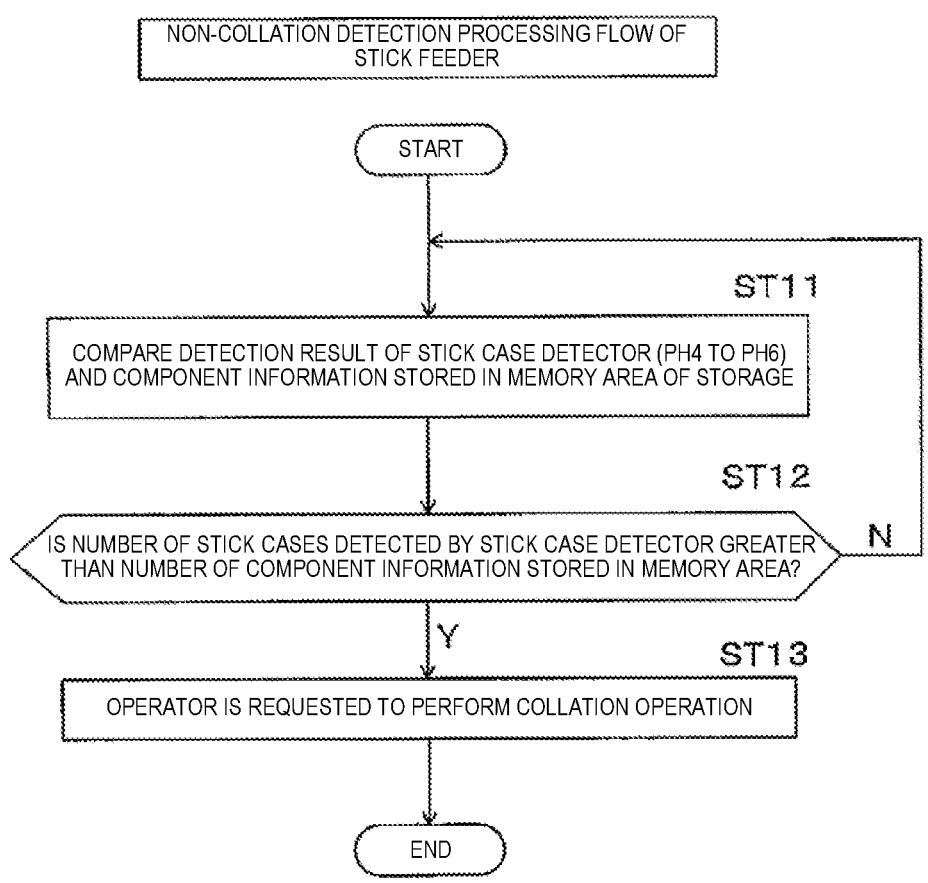
FIG. 7 is a flow diagram of detection processing of the non-collated stick case in the stick feeder of the embodiment of the disclosure.

In FIG. 7, when the detection processing is started, first, the detection result of stick case detector 57 (photo sensors PH4 to PH6) and the component information stored in memory area 53a of component information storage 53, are compared (ST11). In the comparison, determiner 51a determines whether or not the number of stick cases 16 detected by stick case detector 57 is greater than the number of component information stored in memory area 53a (ST12). Here, in a case where it is determined that the number of stick cases 16 detected by stick case detector 57 is greater than the number of the component information stored in memory area 53a, it is determined that non-collated stick case 16 is present in loader 20, and the operator is requested to perform the collation operation (ST13).

Figure 10B:
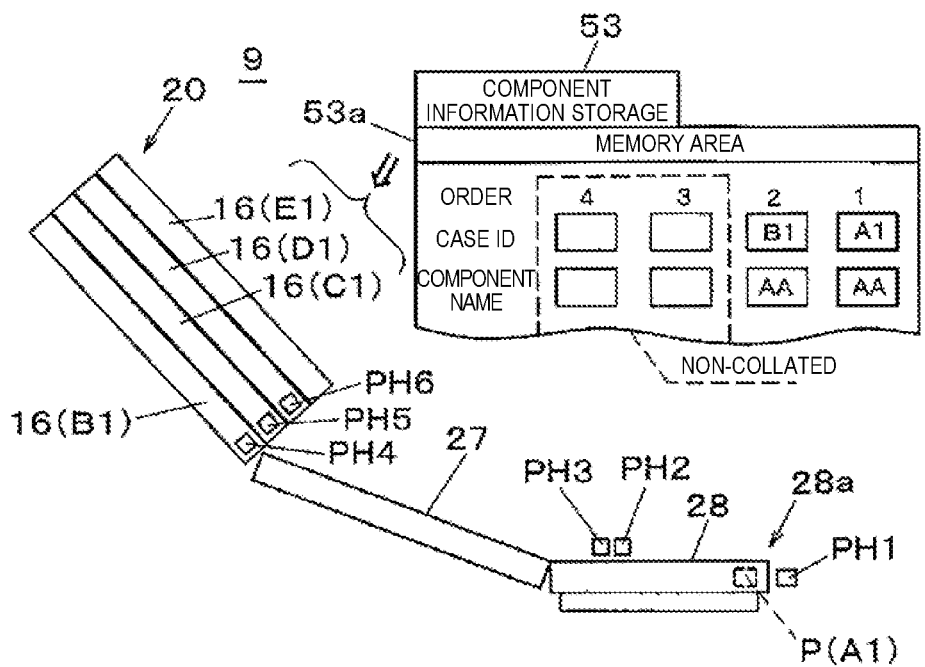
FIG. 10B is a view illustrating the detection processing of the non-collated stick case in the stick feeder of the embodiment of the disclosure.

In other words, similar to the example illustrated in FIG. 10B, even when all of stick case detectors 57 (photo sensors PH4 to PH6) detect that stick cases 16 are present, in a case where the component information regarding orders 3 and 4 is not present in memory area 53a, it is determined that non-collated stick case 16 is present in loader 20.

In the above-described processing, determiner 51a determines that stick case 16 which has not read the component information is stacked on loader 20, from the detection state of stick case detector 57 and the component information of stick case 16 stored in component information storage 53. In addition, in (ST12), in a case where it is determined that the number of stick cases 16 detected by stick case detector 57 is not greater than the number of component information stored in memory area 53a, returning to (ST11), similar processing is repeated.

Figure 11A:
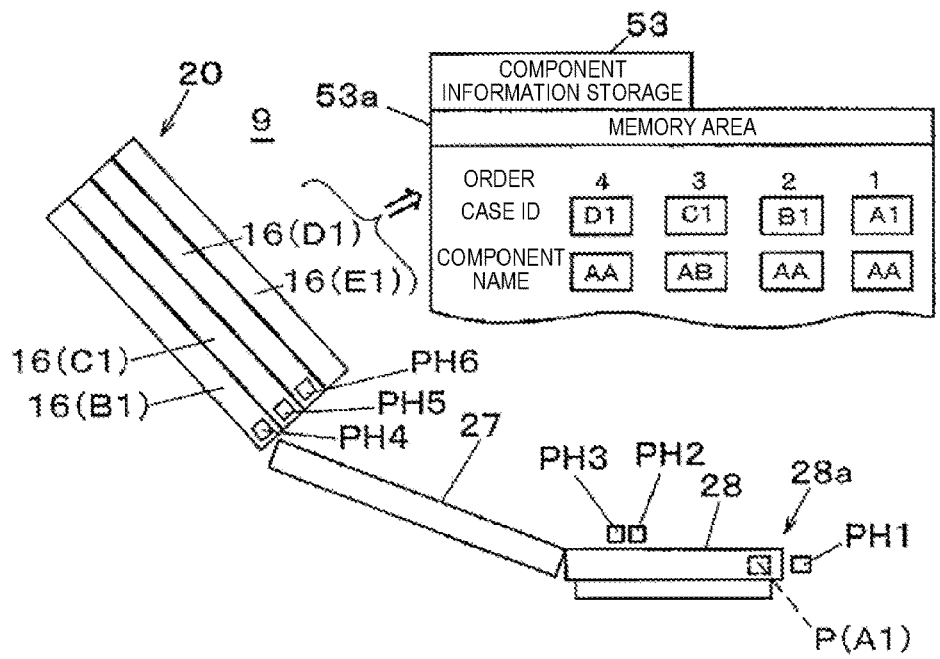
FIG. 11A is a view illustrating the extraction detection processing of the stick case in the stick feeder of the embodiment of the disclosure.
Figure 11B:
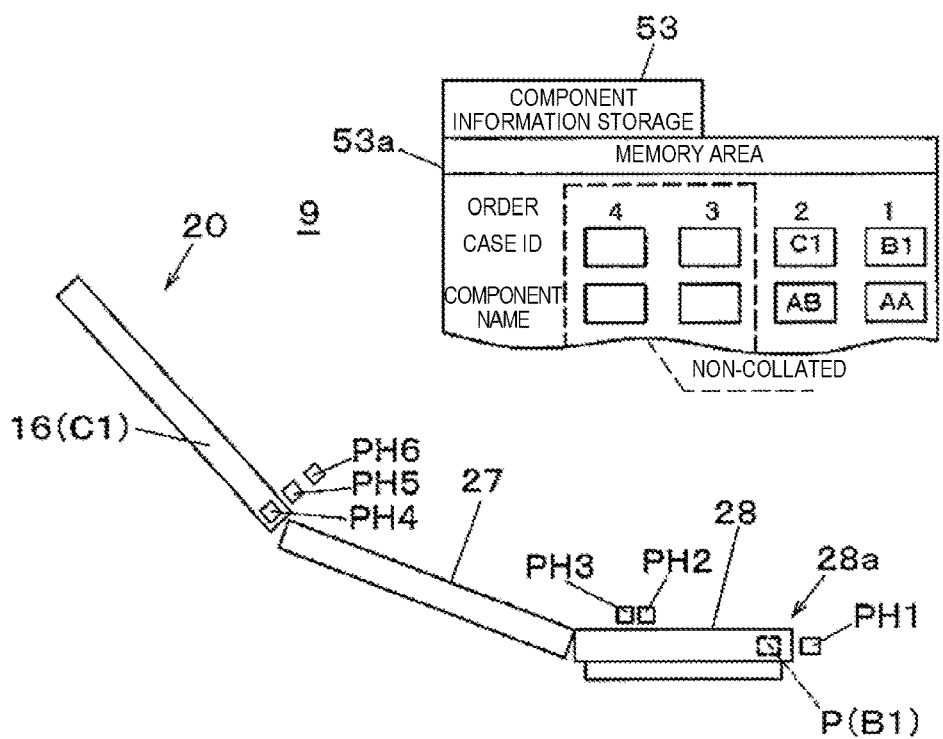
FIG. 11B is a view illustrating the extraction detection processing of the stick case in the stick feeder of the embodiment of the disclosure.

Next, with reference to FIGS. 8, 11A, and 11B, the extraction detection processing of stick case 16 will be described. The extraction detection processing detects whether or not stick case 16 is extracted from loader 20 based on the detection result of stick case detector 57 and the stored contents of memory area 53a. Here, as illustrated in FIG. 11A, an example of a case where stick case 16(D1) is extracted without performing the operation of changing the component information, in a case where (case ID(A1), component name(AA)) is written in the order 1 of memory area 53a, (case ID(B1), component name(AA)) is written in the order 2, (case ID(C1), component name(AB)) is written in the order 3, (case ID(D1), component name(AA)) is written in the order 4, and stick cases 16(B1) to 16(D1) are stacked on loader 20, is illustrated. In other words, as illustrated in FIG. 11B, stick case 16(B1) and stick case 16(C1) remain in loader 20. Therefore, sensor PH6 does not detect stick case 16.

Figure 8:
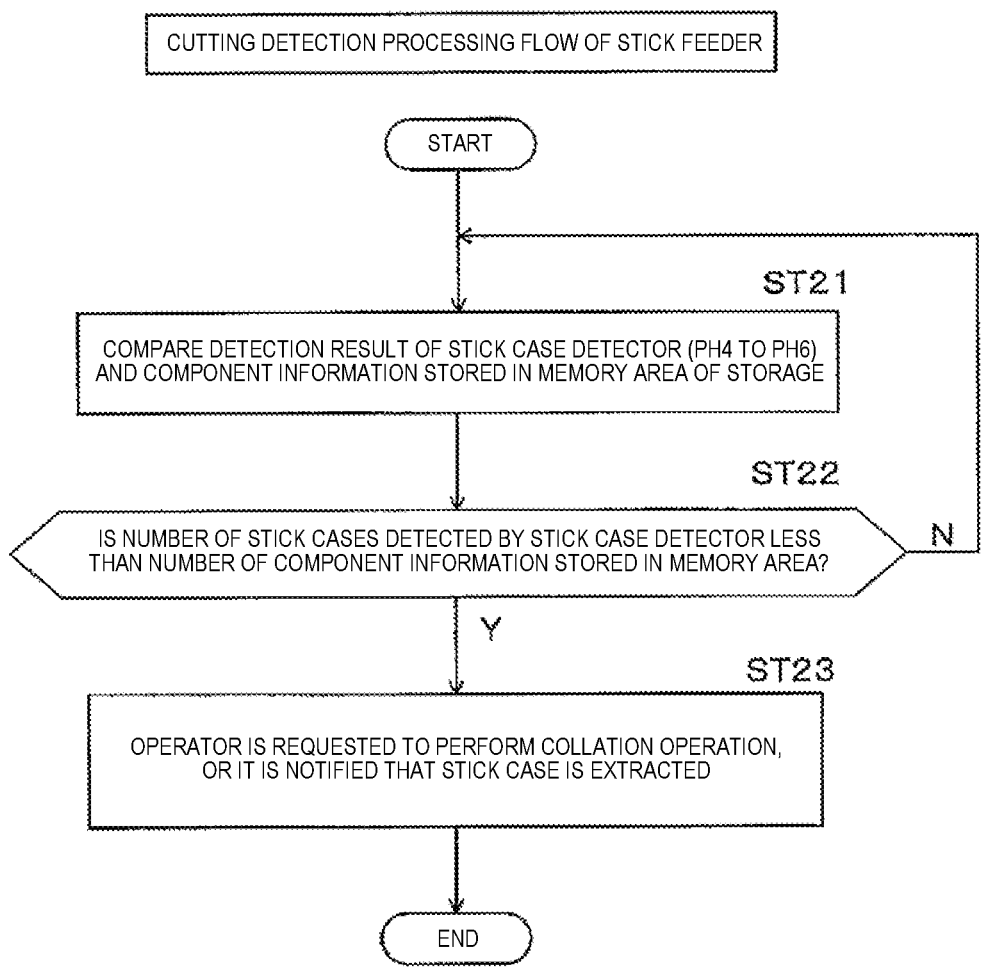
FIG. 8 is a flow diagram of extraction detection processing of the stick case in the stick feeder of the embodiment of the disclosure.

In FIG. 8, when the detection processing is started, first, the detection result of stick case detector 57 (sensors PH4 to PH6) and the component information stored in memory area 53a of component information storage 53, are compared (ST21). In the comparison, it is determined whether or not the number of stick cases 16 detected by stick case detector 57 is less than the number of component information stored in memory area 53a (ST22). Here, in a case where it is determined that the number of stick cases 16 detected by stick case detector 57 is less than the number of the component information stored in memory area 53a, it is determined that stick case 16 is extracted from loader 20, and the operator is requested to perform the collation operation, or it is notified that stick case 16 is extracted by notifier 55 (ST23).

In other words, similar to the example illustrated in FIG. 11B, with respect to a state where sensors PH1, PH4, and PH5 of stick case detector 57 detect the presence of stick case 16, the component information is stored in all of the orders 1 to 4 of memory area. In this manner, in a case where the number of stick cases 16 detected by stick case detector 57 is less than the number of component information of stick case 16 stored in memory area 53a, it is determined that stick case 16 is extracted from loader 20.

Determiner 51a in the above-described processing determines that stick case 16 is extracted from loader 20, from the detection state of stick case detector 57 and the component information of stick case 16 stored in component information storage 53. In addition, in (ST22), in a case where it is determined that the number of stick cases 16 detected by stick case detector 57 is not less than the number of component information stored in memory area 53a, returning to (ST11), similar determination processing is repeated.

In other words, in a component mounting method by component mounting system 1 having the above-described configuration, the component information of stick case 16 stacked on loader 20 is stored in component information storage 53. Next, the presence or the absence of the plurality of stick cases 16 stacked on loader 20 is detected by stick case detector 57, and a state of stick case 16 stacked on loader 20 (extraction of stick case 16 or presence of non-collated stick case 16) is determined from the detection state of stick case 16 and the component information of stick case 16 stored in component information storage 53.

As described above, in stick feeder 9, component mounting system 1, and the component mounting method illustrated in the embodiment, in stick feeder 9 which supplies the electronic component accommodated in stick case 16, loader 20 which stacks stick case 16, component transporter 30 which moves the component supplied from stick case 16 of loader 20 to the predetermined component supply position, and stick case detector 57 which detects the presence or the absence of the plurality of stick cases 16 stacked on loader 20, are included.

In other words, stick feeder 9 (component supply device) illustrated in the embodiment includes: loader 20 which is capable of accommodating the plurality of stick cases 16 in a stacked state; component transporter 30 which moves one or more electronic components P supplied from the plurality of stick cases 16 to predetermined component supply position 28a; and stick case detector 57 (sensors PH4 to PH6) which detects the presence or the absence of the plurality of stick cases 16 in loader 20. In addition, each of the plurality of stick cases 16 is capable of accommodating the plurality of electronic components P, and includes opening 16a in the end portion in the longitudinal direction (the direction in which stick case 16 extends).

In addition, component mounting system 1 illustrated in the embodiment of the disclosure includes: component mounting device M5 (or component mounting device M6) including stick feeder 9 (component supply device); and the managing device which is connected to component mounting device M5 (or component mounting device M6) by the network.

In addition, the component mounting method of the embodiment is the component mounting method in component mounting system 1. In addition, the component information of stick cases 16 accommodated in loader 20 is stored in storage 52, the presence or the absence of one or more stick cases 16 in loader 20 is detected by stick case detector 57, and a state of one or more stick cases 16 accommodated in loader 20 is determined from the detection result of stick case detector 57 and the component information of stick cases 16 stored in storage 52.

In addition, stick feeder 9 (component supply device) and component mounting system 1 illustrated in the embodiment may include: storage 52 which stores the component information of stick cases 16 accommodated in loader 20; and determiner 31a which determines a state of one or more stick cases 16 accommodated in loader 20 from the detection result of stick case detector 57 (sensors PH4 to PH6) and the component information of stick cases 16 stored in storage 52.

Furthermore, in stick feeder 9 (component supply device), component mounting system 1, and the component mounting system illustrated in the embodiment, determiner 31a may determine whether or not at least one stick case 16 which is different from stick cases 16 in which the component information is stored in storage 32 is accommodated in loader 20, from the detection result of stick case detector 57 and the component information of stick cases 16 stored in storage 32.

In addition, in stick feeder 9 (component supply device), component mounting system 1, and the component mounting system illustrated in the embodiment, determiner 31a may determine whether or not all of stick cases 16 in which the component information is stored in storage 32 are accommodated in loader 20, from the detection result of stick case detector 57 and the component information of stick cases 16 stored in storage 32.

Accordingly, by comparing the detection result of stick case detector 57 and the component information of stick case 16 stacked on loader 20 stored in component information storage 53, even in a case where stick case 16 is extracted from stick feeder 9 or new stick case 16 is added to stick feeder 9 while being non-collated, it is possible to accurately determine a state of stick case 16 in the component supply state in stick feeder 9, and to appropriately manage the component supply.

The component supply device, the component mounting system, and the component mounting method of the disclosure have an effect that the state of stick case in the stick feeder can be accurately determined and the component supply can be appropriately managed, and are useful in the field of producing the mounting substrate by mounting the electronic component on the substrate.

What is claimed is:

1. A component supply device comprising:
a loader capable of accommodating a plurality of stick cases in a stacked state, each of the plurality of stick cases capable of accommodating a plurality of electronic components;
a component supply position from which the plurality of electronic components can be picked up by a mounting head;
a component transporter that moves at least one of the plurality of electronic components out from one of the plurality of stick cases and to the component supply position; and
a stick case detector that detects a presence or absence of at least one of the plurality of stick cases in the loader.

2. The component supply device of claim 1, further comprising:
a storage in which component information of the plurality of stick cases accommodated in the loader is stored; and
a determiner configured to determine a state of at least one of the plurality of stick cases accommodated in the loader based on a detection result of the stick case detector and on the component information of the plurality of stick cases stored in the storage.

3. The component supply device of claim 2, wherein the determiner is further configured to determine whether or not the at least one of the plurality of stick cases is different from the plurality of stick cases from which the component information is stored in the storage.

4. The component supply device of claim 2, wherein the determiner is further configured to determine whether or not all of the plurality of stick cases having the component information stored in the storage are accommodated in the loader.

5. The component supply device of claim 2, wherein the determiner is further configured to determine a change of manufacturing lot of at least one of the plurality of stick cases.

6. The component supply device of claim 2, wherein the loader includes a stick case supply position in which the plurality of electronic components are discharged from a stick case positioned in the stick case supply position.

7. The component supply device of claim 1, wherein the stick case detector is a sensor coupled to the loader.

8. The component supply device of claim 1, wherein the loader includes a stick case discharge mechanism.

9. The component supply device of claim 1, wherein the loader includes a stick case supply position at a lowest step in a stacked space of the loader.

10. The component supply device of claim 9, wherein the loader includes a stick case discharge mechanism operable to discharge a stick case positioned in the stick case supply position.

11. A component mounting system comprising:
a component mounting device including a component supply device; and
a managing device being connected to the component mounting device by a network,
wherein the component supply device includes
a loader capable of accommodating a plurality of stick cases in a stacked state, each of the plurality of stick cases capable of accommodating a plurality of electronic components,
a component transporter that moves one or more of the plurality of electronic components from the plurality of stick cases to a component supply position, and
a stick case detector that detects a presence or absence of one or more of the plurality of stick cases in the loader,
wherein the component supply position is located at an end portion of a component transporting path created by the component transporter.

12. The component mounting system of claim 11, further comprising:
a storage in which component information of the plurality of stick cases accommodated in the loader is stored; and
a determiner configured to determine a state of one or more of the plurality of stick cases accommodated in the loader based on a detection result of the stick case detector and on the component information of the plurality of stick cases stored in the storage.

13. The component mounting system of claim 12, wherein the determiner is further configured to determine whether or not the at least one of the plurality of stick cases is different from the plurality of stick cases from which the component information is stored in the storage.

14. The component mounting system of claim 12, wherein the determiner is further configured to determine whether or not all of the plurality of stick cases having the component information stored in the storage are accommodated in the loader.

* * * * *